United States Patent
Kanamori et al.

(10) Patent No.: US 8,039,940 B2
(45) Date of Patent: Oct. 18, 2011

(54) SEMICONDUCTOR STORAGE DEVICE, SEMICONDUCTOR DEVICE, AND MANUFACTURING METHOD THEREFOR

(75) Inventors: Kohji Kanamori, Kawasaki (JP); Teiichirou Nishizaka, Kawasaki (JP); Noriaki Kodama, Kawasaki (JP); Isao Katayama, Kawasaki (JP); Yoshihiro Matsuura, Kawasaki (JP); Kaoru Ishihara, Yamaguchi (JP); Yasushi Harada, Yamaguchi (JP); Naruaki Minenaga, Yamaguchi (JP); Chihiro Oshita, Yamaguchi (JP)

(73) Assignee: Renesas Electronics Corporation, Kanagawa (JP)

( * ) Notice: Subject to any disclaimer, the term of this patent is extended or adjusted under 35 U.S.C. 154(b) by 47 days.

(21) Appl. No.: 11/956,358

(22) Filed: Dec. 14, 2007

(65) Prior Publication Data
US 2008/0099883 A1      May 1, 2008

Related U.S. Application Data

(60) Continuation of application No. 11/398,534, filed on Apr. 6, 2006, now Pat. No. 7,790,579, which is a division of application No. 11/078,447, filed on Mar. 14, 2005, now Pat. No. 7,327,019.

(30) Foreign Application Priority Data

Mar. 12, 2004   (JP) .................................. 2004-070537

(51) Int. Cl.
*H01L 23/26* (2006.01)
(52) U.S. Cl. ................... 257/682; 257/E23.137
(58) Field of Classification Search .................. 257/682, 257/684, 686, E23.137; 438/476
See application file for complete search history.

(56) References Cited

U.S. PATENT DOCUMENTS

| | | | | |
|---|---|---|---|---|
| 4,630,095 A * | 12/1986 | Otsuka et al. | ................. | 257/660 |
| 5,374,842 A * | 12/1994 | Kusakabe | ...................... | 257/487 |
| 5,506,155 A * | 4/1996 | Kaigawa | ....................... | 438/476 |
| 5,539,245 A * | 7/1996 | Imura et al. | ................... | 257/610 |
| 5,648,682 A * | 7/1997 | Nakazawa et al. | ............ | 257/673 |
| 5,721,145 A * | 2/1998 | Kusakabe et al. | ............ | 148/33.3 |
| 5,894,037 A * | 4/1999 | Kikuchi et al. | ............ | 427/372.2 |
| 6,072,239 A | 6/2000 | Yoneda et al. | | |
| 6,268,642 B1 * | 7/2001 | Hsuan et al. | .................. | 257/620 |
| 2002/0047213 A1 * | 4/2002 | Komiyama et al. | ........... | 257/777 |

(Continued)

FOREIGN PATENT DOCUMENTS

CN   1152797   6/1997

(Continued)

OTHER PUBLICATIONS

Computer Translation of JP 2003/224247 (Mitani), pp. 1-11, http://www.jpdl.inpit.go.jp (Sep. 13, 2010).*

(Continued)

*Primary Examiner* — Mary Wilczewski
*Assistant Examiner* — Toniae Thomas
(74) *Attorney, Agent, or Firm* — Young & Thompson

(57) ABSTRACT

According to the present invention, a gettering layer is deposited both on the side surfaces and the bottom surface of a semiconductor chip. The semiconductor chip is then mounted on the board of a package so that a Schottky barrier is formed on the bottom surface. With this structure, metal ions that pass through the board of the package can be captured by the defect layer deposited on the side surfaces and/or the bottom surface of the semiconductor chip, and by the Schottky barrier.

10 Claims, 2 Drawing Sheets

U.S. PATENT DOCUMENTS

2003/0017682 A1 * 1/2003 Saino .......................... 438/476
2005/0285232 A1 * 12/2005 Jiang et al. .................... 257/636

FOREIGN PATENT DOCUMENTS

| JP | 1-215032 | 8/1989 |
| JP | 2-005530 | 1/1990 |
| JP | 4-27126 | 1/1992 |
| JP | 7-302769 | 11/1995 |
| JP | 2003-224247 | 8/2003 |

OTHER PUBLICATIONS

Japanese Patent Office issued a Japanese Office Action dated Nov. 12, 2009, Application No. 2004070537.

Japanese Patent Office issued a Japanese Office Action dated Mar. 31, 2010, Application No. 2004-070537.

* cited by examiner

SEMICONDUCTOR STORAGE DEVICE, SEMICONDUCTOR DEVICE, AND MANUFACTURING METHOD THEREFOR

BACKGROUND OF THE INVENTION

1. Field of the Invention

The present invention relates to a semiconductor device, and particularly to a thin-film semiconductor chip.

2. Related Background Art

Currently, as the functions provided for cellular phones, digital AV apparatuses and IC cards continue to be improved, there is a corresponding increase in the need for highly integrated, thin and compact chips that can be mounted in these devices. Thin chips are also used in the fabrication of an SiP (System in Package) or an MCP (Multi Chip Package), for which a plurality of semiconductor chips are mounted, at high density and in multiple layers, in a single package. Hence, to satisfy the demand for thin film semiconductors, the manufacture of thin chips is required.

An example technique whereby the bottom surface of a silicon substrate is ground to obtain a thin semiconductor chip is disclosed in Japanese Patent Laid-Open Publication No. Hei 7-302769.

The following manufacturing method is disclosed in this publication.

A diffusion layer and an electrode are formed on the top surface of a silicon substrate, and while the bottom surface is ground using a grindstone, a crystal defect layer is introduced. Titanium, Monel and silver are deposited, in the named order, on the bottom surface, to form the crystal defect layer and obtain an ohmic electrode. As the objective of this publication, an ohmic electrode is obtained by using a grindstone having a large grain size to intentionally introduce a crystal defect.

Generally, a semiconductor chip is sealed using a resin, and is attached, at its bottom surface, to an assembly board. According to the above described manufacturing method, since a crystal defect layer is deposited on the bottom surface of the semiconductor chip, an ionized contaminant from the assembly board can be prevented from entering the semiconductor chip through its bottom surface. However, a contaminant that has passed through the resin, can not be prevented from entering the semiconductor chip at a side surface.

SUMMARY OF THE INVENTION

It is, therefore, one objective of the present invention to provide means for at least preventing a contaminant from entering a thin-film semiconductor at a side surface and, more preferably, for also preventing the contaminant from entering through the bottom surface of the chip.

For a semiconductor device according to the present invention, a defect layer for gettering a contaminant is formed on the side surfaces of a semiconductor chip.

More preferably, a defect layer for gettering a contaminant is formed on the bottom surface and the side surfaces of a semiconductor chip.

As described above, since the defect layer is at least deposited on the side surfaces of the semiconductor chip, a contaminant passed through an assembly apparatus or another member can be prevented from entering the semiconductor chip at its side surfaces, or at the bottom and the side surfaces, of the chip.

The present invention, in part, pertains to a semiconductor device having a semiconductor chip with a first semiconductive layer and a second semiconductive layer arranged adjacent to the first semiconductive layer in a horizontal direction, where one of the first and second semiconductive layers includes a gettering layer.

According to the present invention, as described above, a semiconductor chip can be protected from a contaminant, such as metal ions, during the assembly processing.

DETAILED DESCRIPTION OF THE PREFERRED EMBODIMENTS

The preferred embodiments of the present invention will now be described in detail while referring to the accompanying drawings, so as to more clearly define the above objective and other objectives, the features and the effects of the present invention.

Figure 1:
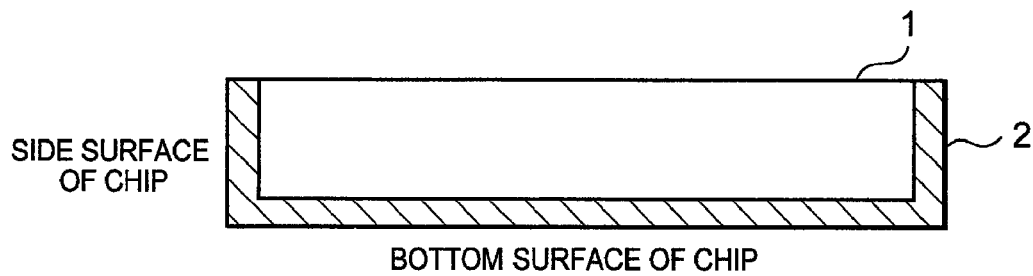
FIG. 1 is a diagram showing a semiconductor chip according to a first embodiment of the present invention.

FIG. 1 is a diagram showing a semiconductor chip according to a first embodiment of the present invention.

A crystal defect layer 2, for gettering a contaminant of metal ions, such as copper ions, is deposited on the side and the bottom surfaces of a semiconductor chip 1.

The presence of the crystal defect layer 2 prevents a contaminant from entering the semiconductor chip 1 through its side surfaces and its bottom surface.

Figure 2A:
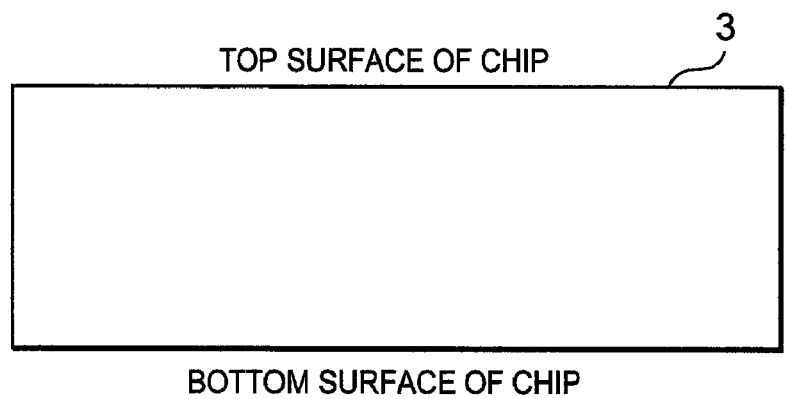
FIGS. 2A and 2B are diagrams showing a method for manufacturing a package that employs the semiconductor chip of the first embodiment.
Figure 2B:
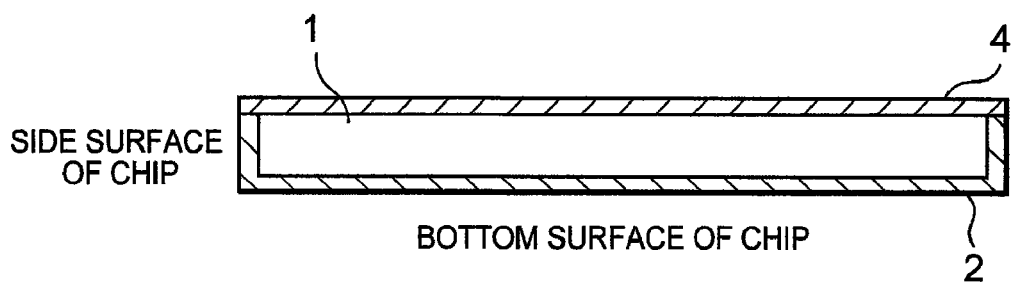
Figure 3:
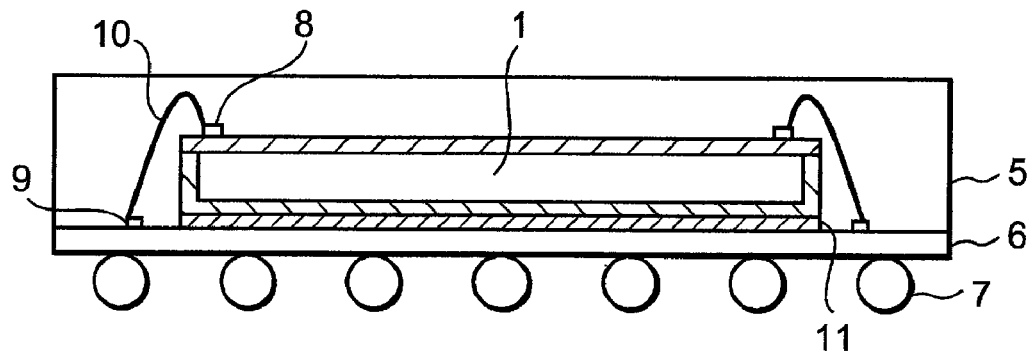
FIG. 3 is a diagram showing the continuation of the manufacturing method shown in FIG. 2.

FIGS. 2A, 2B and 3 are diagrams showing a method for manufacturing a semiconductor device according to the present invention. The manufacturing method will now be explained.

As shown in FIG. 2A, a diffusion layer, a source and gate electrodes and a circuit (none of them shown), which are components of a nonvolatile memory cell, are deposited on the top surface of an 800 μm thick semiconductor substrate 3 made, for example, of silicon. Then, a passivation film 4, made of SiN or SiON, for example, is deposited on the top surface of the resultant substrate 3. Since a fine nitride film is employed as the passivation film 4, a heavy element, such as a copper ion, can not pass through it. Next, the bottom surface of the semiconductor substrate 3 is mechanically ground, using a grindstone, until the thickness thereof is, for example, 110 to 120 μm. A grindstone should be selected that has a grain size large enough to form a crystal defect layer 2 on the bottom surface of the semiconductor substrate 3. The crystal defect layer 2 is a gettering layer for capturing a contaminant, such as a copper ion. Thereafter, the semiconductor substrate 3 is cut, using a blade cutter or a laser cutter, to separate the semiconductor chip 1, and the side surfaces of the chip are ground, using the grindstone, to obtain the crystal defect layer 2 for the side surfaces (see FIG. 2B). It should be noted that so long as a defect layer that can capture a contaminant has already been obtained for the side surfaces of the semiconductor chip 1 when the semiconductor substrate 3 is cut using the blade cutter, the mechanical grinding process may not be performed. Further, a blade used for grinding the bottom surface and a blade used for cutting out the semiconductor chip 1 may have the same sharpness, and a blade #2000, for example, is employed. In this case, the side and the bottom surfaces have about the same roughness. This processing is employed to manufacture the semiconductor chip 1.

As is shown in FIG. 3, the semiconductor chip 1 is mounted on the top surface of an assembly board 6 using mounting tape 11. Then, a pad 8 on the semiconductor chip 1 and a pad 9 on the assembly board 6 are electrically connected by a wire 10. And thereafter, a sealing resin 5 is applied to seal the semiconductor chip 1. Finally, soldering balls 7 are attached to the bottom surface of the assembly board 6. This processing is employed to obtain a BGA (Ball Grid Array) package.

The assembly board 6 is a printed board fabricated by gluing a copper foil to an insulating plate composed of a non-conductive material. The printed wiring for the assembly board 6 is then formed by patterning the copper foil. Thereafter a solder resist coating is applied to all portions of the top surface of the printed board 6 other than the printed wiring to which the wire 10 is soldered. Since copper is diffused in the solder resist, the copper ions in the solder resist are diffused during the assembly process shown in FIGS. 2 and 3. According to the invention, however, since the crystal defect layer 2 has been deposited on the bottom surface of the semiconductor chip 1, the copper ions are captured by the crystal defect layer 2 and are prevented from entering the semiconductor chip 1. And although the copper ions are diffused throughout the sealing resin 5 and reach the side surfaces of the semiconductor chip 1, they are absorbed by the defect layer deposited on the side surfaces of the semiconductor chip 1 and are prevented from entering the semiconductor chip 1. Further, since the passivation film 4 has been formed on the top surface of the semiconductor chip 1, the entry of copper ions through the top surface can also be prevented.

According to this embodiment, an explanation has been given for a non-volatile memory; however, the present invention is effective for other charge storage memories. That is, it is possible to prevent the occurrence of a charge storage failure caused by a contaminant, such as copper ions, that deteriorates the charge storage characteristics. An example charge storage memory can be a flash memory or a DRAM memory.

Figure 4:
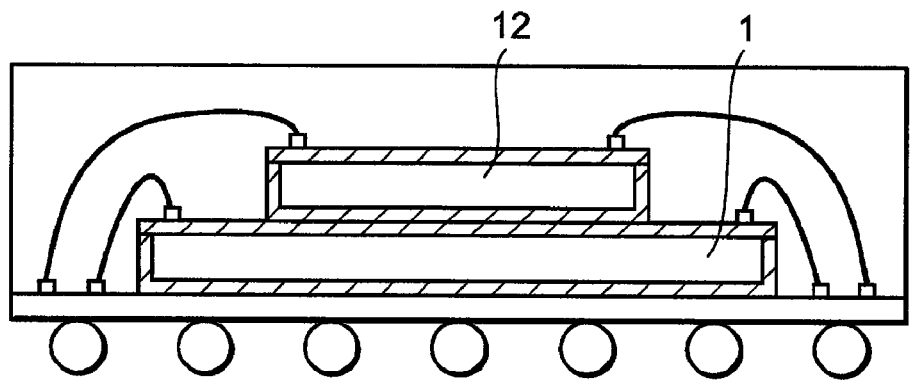
FIG. 4 is a diagram showing a modification of the first embodiment.

FIG. 4 is a diagram showing a modification of the first embodiment wherein semiconductor chips of the invention are laminated to constitute an MCP (a Multi Chip Package). This package is an assembly composed of semiconductor chips, such as a flash memory, an SRAM and a DRAM. A semiconductor chip 1, for example, is a flash memory, and a semiconductor chip 12 is a DRAM. It should be noted that mounting tape 11 is not shown in FIG. 4.

Figure 5:
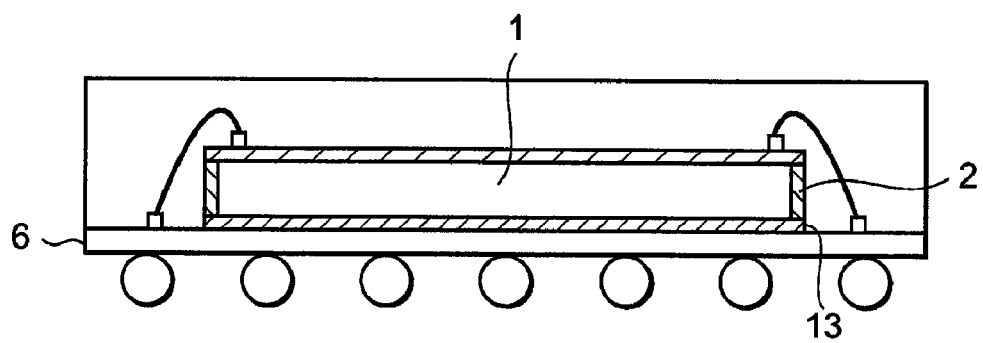
FIG. 5 is a diagram showing a semiconductor device according to a second embodiment of the present invention.

FIG. 5 is a diagram showing a semiconductor device according to a second embodiment of the present invention.

A semiconductor chip 1 is mounted on an assembly board 6 using a mounting member 12 that contains silver, so that the entire bottom surface of the semiconductor chip 1 is covered with the mounting member 12.

By employing the silver-containing mounting member 12, a Schottky barrier is formed between the entire bottom surface of a semiconductor device 3 and the mounting member 12. And since copper ions are very heavy, so long as the Schottky barrier is present, copper ions from the assembly board 6 can not pass the barrier and enter the semiconductor chip 1.

A manufacturing method used to produce this semiconductor device is as follows.

The semiconductor chip 1 is securely mounted on the assembly board 6 by using the silver-containing mounting member 12, so that the entire bottom surface of the chip 1 is covered with the mounting member 12. Since the other processes are the same as those in FIGS. 2 and 3, no further explanation for them will be given.

The present invention is not limited to these embodiments, and it is obvious that the embodiments can be variously modified within the scope of the technical idea of the invention. For example, a semiconductor device employing both the first and the second embodiments can also be provided. That is, a semiconductor device is also available wherein a crystal defect layer is deposited on the bottom surface of the semiconductor chip shown in FIG. 5, and the Schottky barrier is positioned between the defect layer and the assembly board. Furthermore, although in the second embodiment a mounting member containing silver is employed to form the Schottky barrier, so long as a Schottky barrier can be formed, another metal may be employed.

What is claimed is:

1. A semiconductor device comprising:
    a semiconductor chip having a first semiconductive layer and a second semiconductive layer arranged adjacent to the first semiconductive layer in a horizontal direction;
    wherein said first and said second layers are formed of a single unitary body of said semiconductor chip; and
    wherein one of said first and second semiconductive layers is a gettering layer, and said gettering layer comprises a crystal defect layer.

2. The semiconductor device according to claim 1, wherein said gettering layer captures a contaminant.

3. The semiconductor device according to claim 1, wherein said chip has a bottom surface layer, and said bottom surface layer comprises a bottom surface gettering layer.

4. The semiconductor device according to claim 1, said device further comprising a passivation film covering a top surface of said semiconductor chip.

5. A semiconductor device comprising:
    a semiconductor chip including a bottom surface and a side surface;
    wherein said chip has a first gettering layer provided within said semiconductor chip located adjacent to said side surface and having a predetermined thickness from said side surface, said gettering layer having a same height as said side surface.

6. The semiconductor device according to claim 5, wherein said chip has a second gettering layer provided within said semiconductor chip located adjacent to said bottom surface having a predetermined thickness from said bottom surface.

7. The semiconductor device according to claim 5, wherein said gettering layer comprises a crystal defect layer.

8. The semiconductor device according to claim 5, wherein said gettering layer captures a contaminant.

9. The semiconductor device according to claim 5, wherein said chip has a bottom surface layer, and said bottom surface layer comprises a bottom surface gettering layer.

10. The semiconductor device according to claim 5, said device further comprising a passivation film covering a top surface of said semiconductor chip.

* * * * *